(12) United States Patent
Fukuoka et al.

(10) Patent No.: US 9,497,550 B2
(45) Date of Patent: *Nov. 15, 2016

(54) VIBRATION DEVICE, SOUND GENERATOR, SPEAKER SYSTEM, AND ELECTRONIC DEVICE

(71) Applicant: KYOCERA Corporation, Kyoto-shi, Kyoto (JP)

(72) Inventors: Shuichi Fukuoka, Kirishima (JP); Noriyuki Kushima, Kirishima (JP); (Continued)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/369,079

(22) PCT Filed: Nov. 29, 2012

(86) PCT No.: PCT/JP2012/080902
§ 371 (c)(1),
(2) Date: Jun. 26, 2014

(87) PCT Pub. No.: WO2013/099512
PCT Pub. Date: Jul. 4, 2013

(65) Prior Publication Data
US 2014/0321677 A1     Oct. 30, 2014

(30) Foreign Application Priority Data
Dec. 26, 2011 (JP) ................... 2011-283673
Sep. 27, 2012 (JP) ................... 2012-214489

(51) Int. Cl.
*H04R 17/00*     (2006.01)
*H01L 41/09*     (2006.01)

(52) U.S. Cl.
CPC ............ *H04R 17/00* (2013.01); *H01L 41/09* (2013.01)

(58) Field of Classification Search
CPC ................ H04R 2440/00–2440/07; H04R 19/00; H04R 19/01; H04R 19/013;
(Continued)

(56) References Cited

U.S. PATENT DOCUMENTS 4,654,554 A      3/1987  Kishi
6,278,787 B1 *   8/2001  Azima ................. G07F 9/02
                                              381/152
(Continued)

FOREIGN PATENT DOCUMENTS

CN     1547416 A     11/2004
JP    57-128299 U     8/1982
(Continued)

OTHER PUBLICATIONS

International Search Report, PCT/JP2012/080902, Jan. 7, 2013, 2 pgs.
(Continued)

*Primary Examiner* — Suhan Ni
(74) *Attorney, Agent, or Firm* — Volpe and Koenig, P.C.

(57) ABSTRACT

The vibration device includes a vibration body, an exciter, and a load member. The exciter causes the vibration body to vibrate. The load member is attached to a part of the vibration body. The load member is not contacted to the exciter. The load member is configured to reduce an amplitude of the part of the vibration body where the load member is attached.

9 Claims, 13 Drawing Sheets

(72) Inventors: Hiroshi Ninomiya, Kirishima (JP);
Takeshi Hirayama, Kirishima (JP)

(58) Field of Classification Search
CPC .............. H04R 19/016; H04R 1/02; H04R 1/025; H04R 1/026; H04R 9/00; H04R 9/025; H04R 9/027
USPC ....... 381/152, 191, 386, 396, 417–418, 190, 381/431
See application file for complete search history.

(56) References Cited

U.S. PATENT DOCUMENTS

| | | |
|---|---|---|
| 6,519,346 B1 | 2/2003 | Asada et al. |
| 6,731,764 B2 * | 5/2004 | Asada et al. ............. 381/152 |
| 2001/0043714 A1 | 11/2001 | Asada et al. |

FOREIGN PATENT DOCUMENTS

| | | |
|---|---|---|
| JP | 58-184995 U | 12/1983 |
| JP | 60-043998 A | 3/1985 |
| JP | 62-014599 A | 1/1987 |
| JP | 63-181097 U | 11/1988 |
| JP | 04-007999 A | 1/1992 |
| JP | 2004-023436 A | 1/2004 |
| JP | 2010-177867 A | 8/2010 |

OTHER PUBLICATIONS

Taiwanese Office Action with English concise explanation, Taiwanese Patent Application No. 101150183, Aug. 21, 2015, 6 pgs.
Japanese Decision to Decline Amendment with English concise explanation, Japanese Patent Application No. 2013-551548, Dec. 1, 2015, 5 pgs.
Japanese Reconsideration Report with English concise explanation, JP 2013-551548, Mar. 23, 2016, 5 pgs.
Ishihama, M., et al., "320 Development of Vibro-Acoustic Design Method of Flat Panel Speakers," The Japan Society of Mechanical Engineers, [No01-5] Dynamics and Design Conference 2001 CD-ROM, Journal [2001.8.6-9, Tokyo], Japan, [Online], Aug. 2001[Search date Mar. 23, 2016], Internet: <URL: http//www.jsme.or.jp/monograph/dmc12001/date/pdf/320.pdf>.
Chinese Office Action with English concise explanation, Chinese Patent Application No. 101150183, Aug. 21, 2015, 6 pgs.

* cited by examiner

VIBRATION DEVICE, SOUND GENERATOR, SPEAKER SYSTEM, AND ELECTRONIC DEVICE

TECHNICAL FIELD

The present invention relates to a vibration device, an acoustic generator, a speaker system, and an electronic apparatus.

BACKGROUND ART

Speakers that include a diaphragm and a piezoelectric element attached to the diaphragm have thus far been known (refer to Patent Literature 1, for example).

CITATION LIST

Patent Literature

Patent Literature 1: Japanese Unexamined Patent Publication JP-A 2004-23436

SUMMARY OF INVENTION

Technical Problem

However, the conventional speakers often incur drastic fluctuation of acoustic pressure at a specific frequency, and a remarkable peak dip appears in the frequency characteristic of the acoustic pressure.

The present invention has been accomplished in view of the foregoing drawback, and provides a vibration device that suppresses drastic fluctuation of amplitude at a specific frequency, and an acoustic generator, a speaker system, and an electronic apparatus incorporated with such a vibration device.

Solution to Problem

The present invention provides a vibration device including a vibration body, an exciter that causes the vibration body to vibrate, and a load member attached to a part of the vibration body and not contacted to the exciter, and configured to reduce amplitude of the part of the vibration body where the load member is attached.

The present invention also provides an acoustic generator including at least a speaker, and a support member to which the speaker is attached. The speaker includes the foregoing vibration device.

The present invention also provides a speaker system including at least a low range speaker, at least a high range speaker, and a support member that supports the low range speaker and the high range speaker. At least one of the low range speaker and the high range speaker includes the foregoing vibration device.

The present invention further provides an electronic apparatus including at least a speaker, a support member to which the speaker is attached, and an electronic circuit connected to the speaker. The speaker includes the foregoing vibration device, and the electronic apparatus is configured to generate a sound from the speaker.

ADVANTAGEOUS EFFECTS OF INVENTION

The vibration device configured as above according to the present invention is capable of suppressing drastic fluctuation of amplitude at a specific frequency.

The acoustic generator configured as above according to the present invention is capable of generating a sound in which drastic fluctuation of amplitude at a specific frequency is suppressed.

The speaker system configured as above according to the present invention is capable of generating a sound in which drastic fluctuation of amplitude at a specific frequency is suppressed.

The electronic apparatus configured as above according to the present invention is capable of generating a sound in which drastic fluctuation of amplitude at a specific frequency is suppressed.

DESCRIPTION OF EMBODIMENTS

Hereafter, embodiments of a vibration device, an acoustic generator, a speaker system, and an electronic apparatus according to the present invention will be described in details, with reference to the accompanying drawings.

(First Embodiment)

Figure 1:
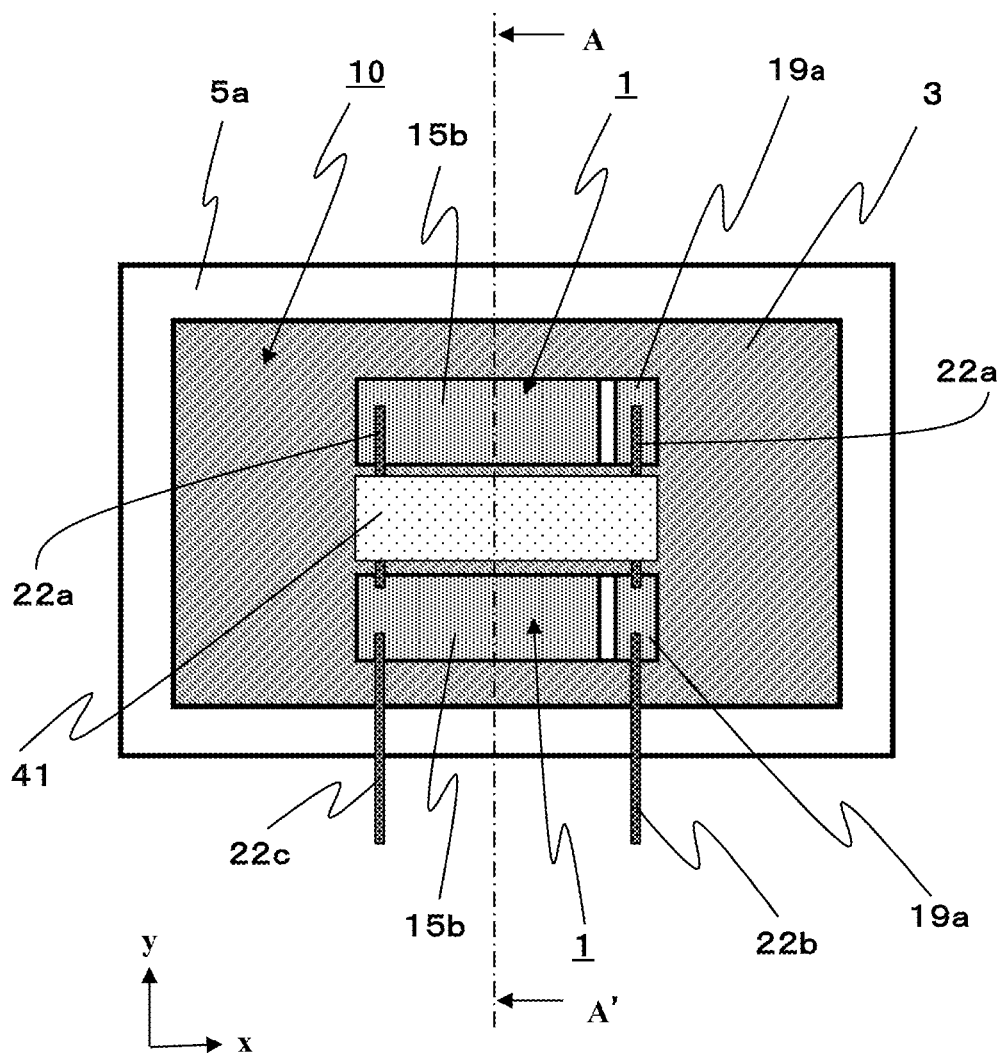
FIG. 1 is a schematic plan view showing a vibration device according to a first embodiment of the present invention.
Figure 2:
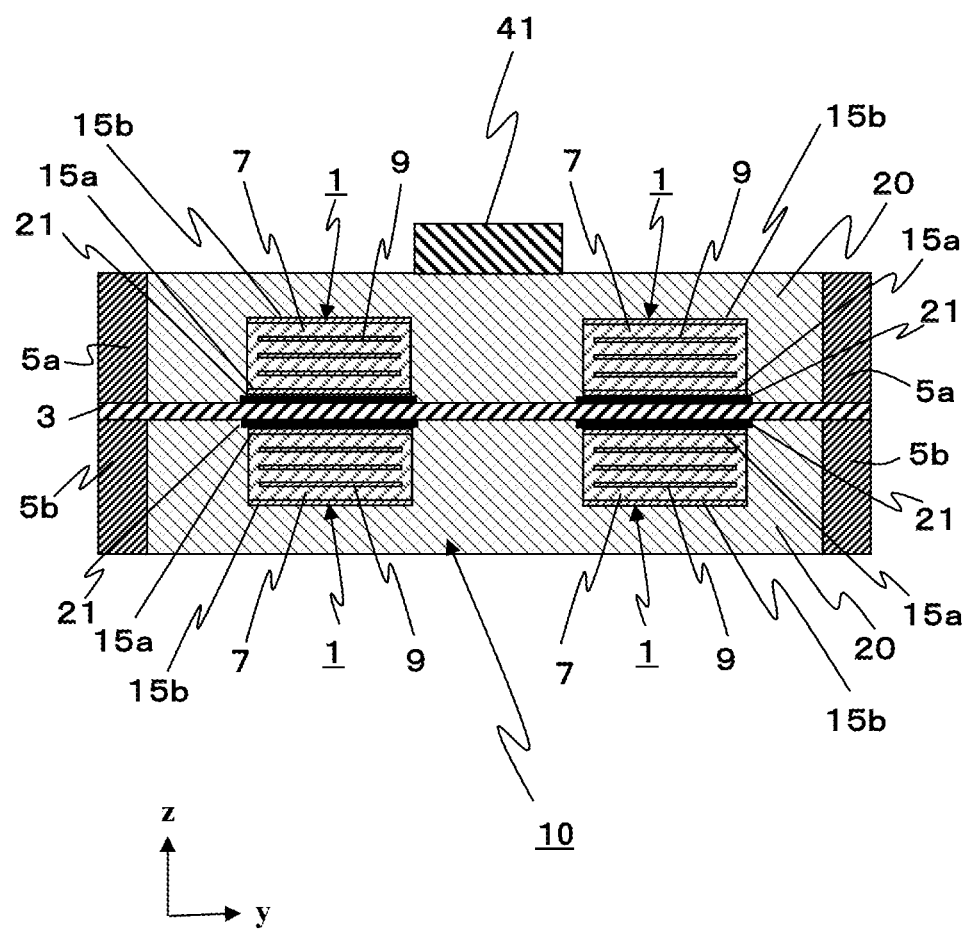
FIG. 2 is a cross-sectional view taken along a line A-A' in FIG. 1.

FIG. 1 is a schematic plan view showing a vibration device according to a first embodiment of the present invention. FIG. 2 is a cross-sectional view taken along a line A-A' in FIG. 1. For the sake of visual clarity, a resin layer 20 is excluded from FIG. 1, and FIG. 2 is illustrated in an enlarged scale in a thickness direction of the vibration device (z-axis direction in FIG. 2).

The vibration device according to this embodiment includes, as shown in FIG. 1 and FIG. 2, a plurality of exciters 1, a film 3, frame members 5a, 5b, a resin layer 20, and leads 22a, 22b, and 22c. The inner region of the frame members 5a, 5b is configured to serve as a vibration body 10. The vibration device according to this embodiment also includes a load member 41 provided on the vibration body 10.

The frame members 5a, 5b each have a rectangular frame shape. The frame members 5a, 5b hold the outer peripheral portion of the film 3 therebetween, so as to fix the film 3 with a tension applied thereto. A stainless steel having a thickness of 100 to 1000 μm may be preferably employed to form the frame members 5a, 5b, although the material and the thickness of the frame members 51, 5b are not specifically limited. A material that is less deformable than the film 3 and the resin layer 20 constituting the vibration body 10, for example a hard resin, a plastic, an engineering plastic, or a ceramic, may be employed to form the frame members 5a, 5b. In addition, the shape of the frame members 5a, 5b is not limited to rectangular, but may be, for example, circular or a diamond shape.

The film 3 has the overall periphery of the rectangular shape held between the frame members 5a, 5b under a tension applied thereto in a plane direction, thus to be vibratably supported by the frame members 5a, 5b. The film 3 has a thickness of, for example, 10 to 200 μm. The film 3 may be formed of a resin such as polyethylene, a polyimide resin, polypropylene, or polystyrene, or a paper formed of pulp or fiber. Such materials are appropriate for minimizing a peak dip in the vibration characteristic.

The exciters 1 are piezoelectric elements configured to vibrate upon receipt of an electrical signal. Two each of the exciters 1 constitute a pair, and the two exciters 1 of the same pair are located on the respective surfaces of the film 3 so as to hold the film 3 therebetween. When one of the pair of exciter 1 is caused to shrink, the other of the pair is caused to stretch.

Two exciters 1 are attached to each of the surfaces of the film 3, i.e., totally four exciters 1 are attached to the film 3. On each of the surfaces of the film 3, two exciters are aligned in a width direction of the rectangular film 3 (y-axis direction in FIGS. 1 and 2) with a spacing therebetween, in a central region of the rectangular film 3 in the longitudinal direction (x-axis direction in FIG. 1).

The exciters 1 each include upper and lower main surfaces of a rectangular plate shape. In addition, the exciters 1 each include a multilayer structure composed of four ceramic piezoelectric layers 7 and three inner electrode layers 9 alternately stacked, surface electrode layers 15a, 15b respectively formed on the upper and lower surfaces of the multilayer structure (end faces in the z-axis direction in FIG. 2), and a pair of outer electrodes (not shown) provided on the respective end faces (lateral faces) of the multilayer structure in the longitudinal direction (x-axis direction in FIG. 1). The inner electrode layers 9 are alternately drawn out from the respective end faces of the multilayer structure in the longitudinal direction (x-axis direction in FIG. 1), and are respectively connected to the pair of outer electrodes (not shown).

In the exciter 1, one of the outer electrodes (not shown) is connected to the surface electrode layers 15a, 15b and the intermediate one of the inner electrode layers 9, and the other outer electrode (not shown) is connected to the upper and lower inner electrode layers 9. The piezoelectric layers 7 are each polarized in the thickness direction (z-axis direction in FIG. 2). The piezoelectric layers 7 are each polarized in the thickness direction (z-axis direction in FIG. 2), such that the adjacent layers of the dielectric layers 7 are polarized in opposite directions to each other. A voltage is applied to the pair of outer electrodes (not shown) of each of the exciters 1, so as to stretch the piezoelectric layer 7 of the exciter 1 on the lower surface of the film 3 when the piezoelectric layer 7 of the exciter 1 on the upper surface of the film 3 is caused to shrink.

The upper and lower end portions of the other outer electrode (not shown) respectively extend to the upper and lower surfaces of the multilayer structure, thus constituting extensions 19a. Each of the extensions 19a is spaced from the surface electrode layers 15a, 15b on the surface of the multilayer structure by a predetermined distance, so as to avoid a contact with the surface electrode layers 15a, 15b.

Between the two exciters 1, the respective extensions 19a on the side opposite to the film 3 are connected to each other via the lead 22, and the respective surface electrode layers 15b are connected to each other via the lead 22a. On one of the exciters 1, the extension 19a is connected to an end portion of the lead 22b and the surface electrode layer 15b is connected to an end portion of the lead 22c. The other end portions of the lead 22b and the lead 22c are drawn out to outside. Thus, the pair of exciters 1 are connected in parallel, and the same voltage is applied to the exciters 1 through the leads 22b, 22c.

The piezoelectric layer 7 may be formed of a known piezoelectric ceramic, such as lead zirconate (PZ), lead zirconate titanate (PZT), or a lead-free piezoelectric material such as a Bi layered compound or a compound having a tungsten-bronze type structure. It is preferable that each of the piezoelectric layers 7 has a thickness of 10 to 100 μm, from the viewpoint of low-voltage driving. In addition, it is preferable that the piezoelectric layer 7 has a d31 piezoelectric coefficient not lower than 180 pm/V, in order to induce a large flexural vibration to thereby increase the acoustic pressure.

It is preferable that the inner electrode layer 9 contains metal components including silver and palladium and material components constituting the piezoelectric layer 7. Employing the ceramic component constituting the piezoelectric layer 7 as a part of the inner electrode layer 9 reduces stress originating from difference in thermal expansion between the piezoelectric layer 7 and the inner electrode layer 9, and thus minimizes defective layer structure in the exciter 1. The material to be contained in the inner electrode layer 9 is not limited to silver and palladium. The ceramic material to be contained in the inner electrode 9 is not limited to those constituting the piezoelectric layer 7, but may be other ceramics (not shown).

It is preferable that the surface electrode layers 15a, 15b and the pair of outer electrodes (not shown) contain a silver-based metal component and a glass component mixed therein. Employing the glass component increases the adhesion between the piezoelectric layer 7 or the inner electrode layer 9 and the surface electrode layers 15a, 15b or the pair of outer electrodes.

The main surface of the exciters 1 on the side of the film 3 is bonded to the film 3 via an adhesive layer 21. It is preferable that the adhesive layer 21 is not thicker than 20 μm, and more preferably not thicker than 10 μm. Forming the adhesive layer 21 in a thickness of 20 μm or less facilitates the transmission of the vibration of the exciter 1 to the film 3. To form the adhesive layer 21, an adhesive made of a known resin such as an epoxy-based resin, a silicone-based resin, and a polyester-based resin.

The resin layer 20 is filled in the entirety of the inner region of the frame members 5a, 5b so as to bury the exciter 1. The lead 22a and a part of the lead 22b and the lead 22c are also buried in the resin layer 20. The resin layer 20 may be formed of a resin such as an acrylic-based resin or a silicone-based resin, or rubber, and preferably the resin layer 20 may have a Young's modulus of 1 MPa to 1 GPa, and more preferably 1 MPa to 850 MPa. In addition, it is preferable that the resin layer 20 has a thickness sufficient to cover the entirety of the exciters 1, from the viewpoint of suppressing spurious.

The film 3, the plurality of exciters 1 provided thereon, the lead 22a and a part of the leads 22b and 22c are unified by being covered with the resin layer 20, thus to form the vibration body 10 as a whole. Thus, the vibration body 10 has a flat shape (film shape), and has the overall periphery of the rectangular shape supported by the frame members 5a, 5b. When an electrical signal is inputted through the leads 22a, 22b, 22c the exciters 1 are caused to vibrate, and therefore the vibration body 10 is caused to vibrate thus to serve as a speaker that generates a sound. Thus, the exciters 1 are configured to cause the vibration body 10 to vibrate, upon receipt of an electrical signal.

The load member 41 has a rectangular sheet shape, and is attached to the central region of the vibration body 10. In other words, the load member 41 is located in the central region of the vibration body 10 in the longitudinal direction (x-axis direction in FIG. 1) as well as in the width direction (y-axis direction in FIGS. 1, 2). In addition, the load member 41 is attached to the vibration body 10 at a position spaced from the exciters 1. In other words, the load member 41 is attached to the vibration body 10 so as not to make direct contact with the exciters 1.

The load member 41 may be formed of various materials such as a synthetic resin, a metal, or a ceramic. From the viewpoint of reducing irregular distribution of amplitude on the vibration body 10, it is preferable that the load member 41 is soft and easy to deform, and examples of such a material include rubber materials such as urethane rubber, silicone rubber, and acrylic rubber. In particular, a porous rubber (foamed rubber) made from urethane rubber, silicone rubber, or polyethylene rubber may be preferably employed. Above all, urethane foam is preferable.

The load member 41 may be formed in a desired outer shape such as square, rectangular, circular, elliptical, or strip-shape, according to the shape of the region there vibration is to be suppressed. The load member 41 may be formed in an appropriate thickness according to the density of the material constituting the load member 41. It is preferable to make the load member 41 thicker when the density is lower, and thinner when the density is higher. The length and width of the load member 41 may be set, for example, to 10% to 70% of the length and width of the vibration body 10, and the thickness of the load member 41 may be set to a half to three times of the thickness of the vibration body 10.

Since the vibration device according to this embodiment includes the load member 41 attached to a part of the vibration body 10, the amplitude of the portion of the vibration body 10 where the load member 41 is attached can be suppressed. Accordingly, drastic fluctuation of amplitude at a specific frequency can be suppressed. Therefore, in the frequency characteristic of the sound generated from the vibration of the vibration body 10, drastic fluctuation of amplitude at a specific frequency can be prevented, and therefore the vibration device is capable of generating a high-quality sound with reduced distortion.

Since the load member 41 is attached to the vibration body 10 so as not to contact the exciters 1 in the vibration device according to this embodiment, the vibration generated by the exciters 1 is exempted from being directly suppressed by the load member 41. Therefore, the vibration of the vibration body 10 can be prevented from being generally weakened.

In the vibration device according to this embodiment, the overall periphery of the vibration body 10 of the rectangular shape is supported by the frame members 5a, 5b, and the load member 41 is attached to the central region of the vibration body 10 in both longitudinal and width directions. According to studies pursued by the present inventors, the vibration body 10 vibrates in maximal amplitude in the central region thereof, at a plurality of frequencies in the vibration frequency range of the vibration body 10, and the load member 41 is attached to such a region. Therefore, drastic fluctuation of amplitude can be suppressed at a plurality of frequencies in the vibration frequency range of the vibration body 10. Attaching thus the load members 41 to the region where the amplitude becomes maximal at least at a certain frequency in the vibration frequency range of the vibration body 10 allows suppression of the drastic fluctuation of amplitude at that frequency.

Further, the load member 41 of the vibration device according to this embodiment is formed of a material that is softer and more deformable than the vibration body 10. More specifically, the load member 41 is formed of a material that is softer and more deformable than the materials respectively constituting the film 3, the exciters 1, the leads 22a, 22b, 22c and the resin layer 20, in the vibration body 10. Here, the expression "soft and deformable" means less elastic and rigid, and easy to deform with a force. Employing a material softer and more deformable than the vibration body 10 to form the load member 41 exempts the portion of the vibration body 10 where the load member 41 is attached from disturbance against the deformation, thereby enabling the vibration body 10 to be smoothly deformed. Such a configuration contributes to reducing distortion of the sound generated from the vibration of the vibration body 10. Although it is preferable that the load member 41 is formed of a material that is softer and more deformable than the vibration body 10 as stated above, the load member 41 may be otherwise formed.

Further, the vibration device according to this embodiment is configured to emit, by causing the vibration body 10 to vibrate, a sound in the vibration direction of the vibration body 10, i.e., in one direction along the z-axis direction (+z direction) perpendicular to the surface of the vibration body 10, and the load member 41 of a porous material is attached to one of the surfaces (on the +z side) of the vibration body 10. Such a configuration can further reduce the acoustic pressure of the sound generated at the position where the load member 41 is attached, compared with the case where the load members 41 is attached to the opposite surface (on the −z side) of the vibration body 10.

The vibration device according to this embodiment can be manufactured, for example as described hereunder.

First, a binder, a dispersion agent, a plasticizer, and a solvent are added to powder of a piezoelectric material, and the mixture is stirred so as to make up a slurry. The piezoelectric material may be either a lead based material or a lead-free material. Then the slurry is formed into a sheet shape, thus forming a green sheet. A conductive paste is printed on the green sheet so as to form a conductor pattern, which is to be finished as the inner electrode 9, and a plurality of the green sheets each having the conductor pattern formed thereon are stacked to form a multilayer block.

The multilayer block is then degreased and sintered, and cut into a predetermined size thus to obtain a plurality of multilayer structures. The outer peripheral portion of the multilayer structure is processed if need be. Then a conductive paste is printed on each of the main surfaces of the multilayer structure in the stacking direction so as to form a conductor pattern, which is to be finished as the surface electrode layer 15a or 15b, and a conductive paste is printed on each of the lateral faces of the multilayer structure in the longitudinal direction (x-axis direction in FIG. 1) so as to form a conductor pattern which is to be finished as the pair of outer electrodes (not shown). Then upon baking the electrodes at a predetermined temperature, the structure which is to be finished as the exciter 1 can be obtained. To give a piezoelectric property to the exciter 1, a DC voltage is applied through the surface electrode layers 15a, 15b or the pair of outer electrodes (not shown) so as to polarize the piezoelectric layers 7 of the exciter 1. At this point, the adjacent layers of the dielectric layers 7 are polarized in opposite directions to each other. Throughout the foregoing process, the exciter 1 shown in FIG. 1 and FIG. 2 can be obtained.

Then the film 3 is prepared. The outer peripheral portion of the film 3 is held between the frame members 5a, 5b, and fixed with a tension applied to the film 3. An adhesive is applied to both surfaces of the film 3 and the exciters 1 are pressed against the surfaces of the film 3 so as to hold the film 3 therebetween, and the adhesive is cured by heat or UV irradiation. Upon introducing a resin into the inner region of the frame members 5a and curing the resin after connecting the leads 20a, 20b, 20c, the resin layer 20 is obtained. The vibration device according to this embodiment can thus be obtained.

(Second Embodiment)

Figure 3:
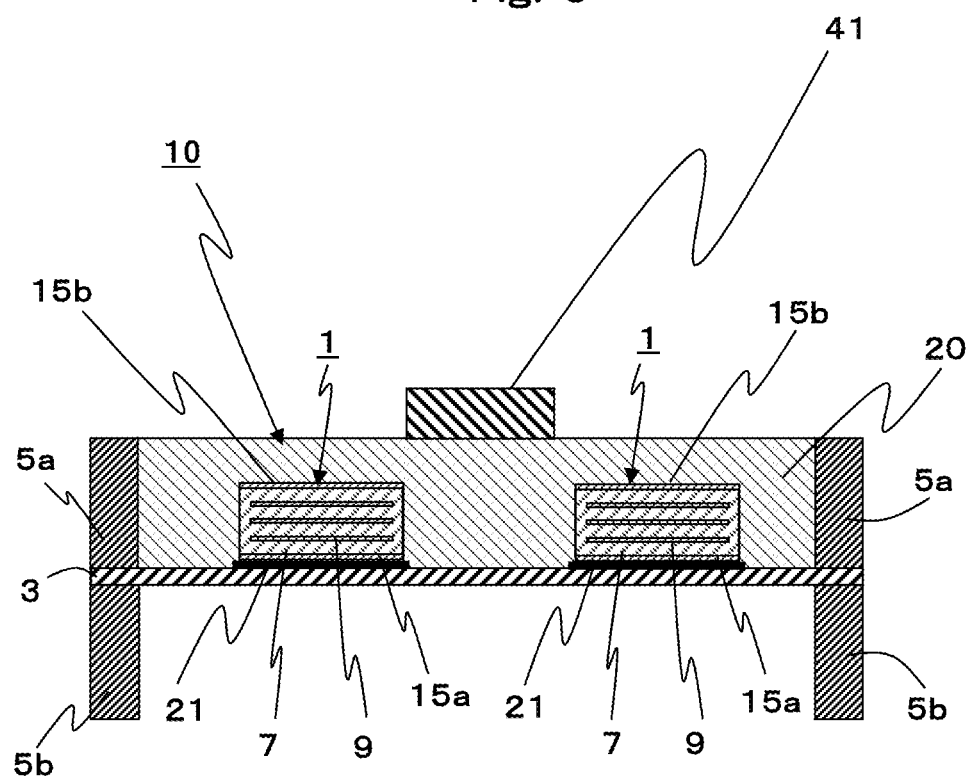
FIG. 3 is a schematic cross-sectional view showing a vibration device according to a second embodiment of the present invention.

FIG. 3 is a schematic perspective view showing a vibration device according to a second embodiment of the present invention. The description of this embodiment will be focused on differences from the vibration device according to the first embodiment shown in FIG. 1 and FIG. 2, and the same constituents are given the same numeral and the description thereof will not be repeated. For the sake of visual clarity, FIG. 3 is illustrated in an enlarged scale in a thickness direction of the vibration device (z-axis direction in FIG. 3).

In the vibration device according to this embodiment, the two exciters 1 are attached to only one of the surfaces of the film 3, as shown in FIG. 3. The resin layer 20 is also formed only on the side where the exciters 1 are provided. Each of the exciters 1 is a bimorph piezoelectric element, configured such that one side and the other side in the thickness direction (z-axis direction in FIG. 3) stretch and shrink oppositely, at a given instant upon receipt of an electrical signal. In other words, when one side in the thickness direction stretches the other side shrinks. Accordingly, the exciters 1 each flexurally vibrate upon receipt of an electrical signal. The vibration device thus configured according to this embodiment also works in the same way as the vibration device according to the first embodiment. Here, the exciters 1 employed in the vibration device according to this embodiment may be, for example, a unimorph piezoelectric element composed of a piezoelectric element that vibrates so as to stretch and shrink and a metal plate coupled with each other.

(Third Embodiment)

Figure 4:
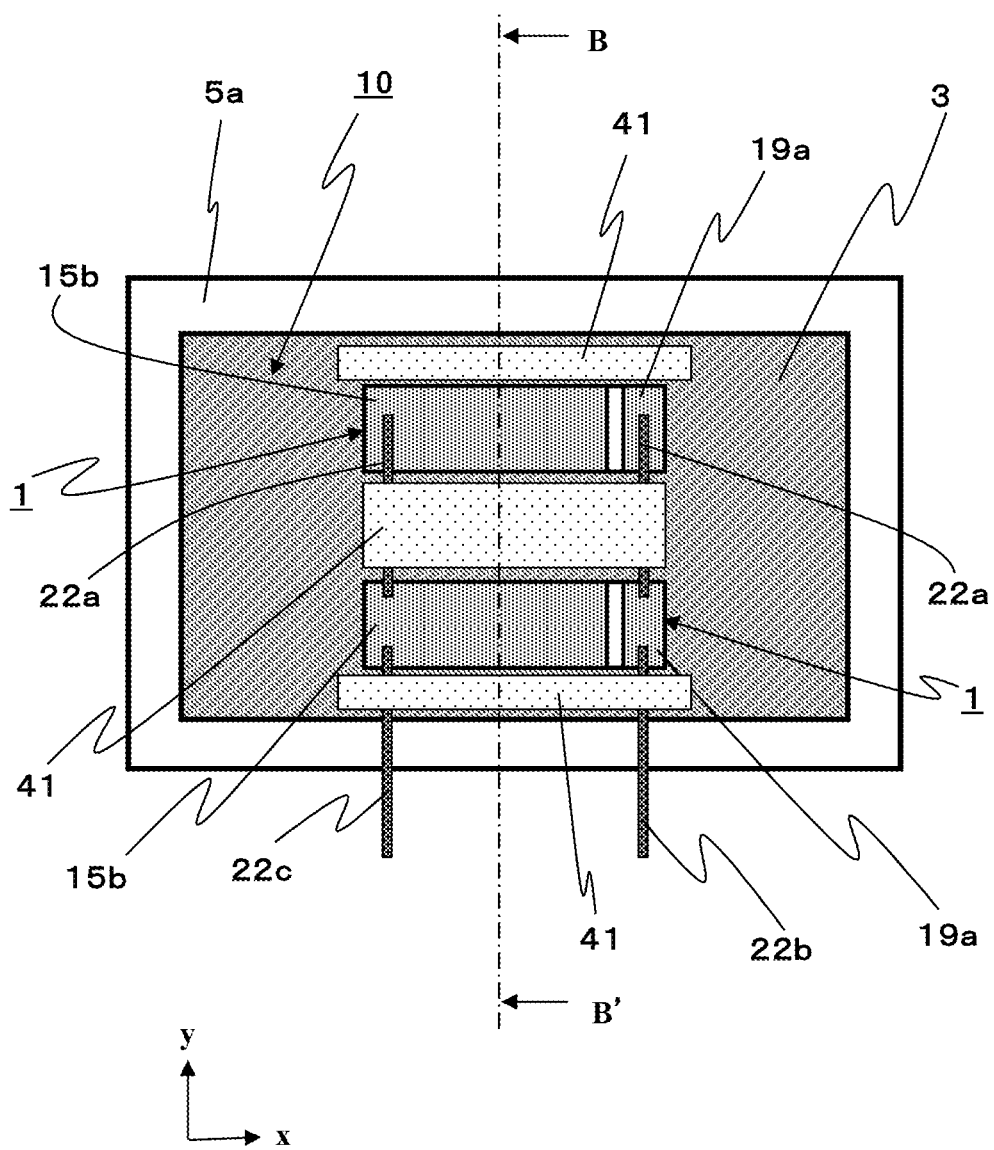
FIG. 4 is a schematic plan view showing a vibration device according to a third embodiment of the present invention.
Figure 5:
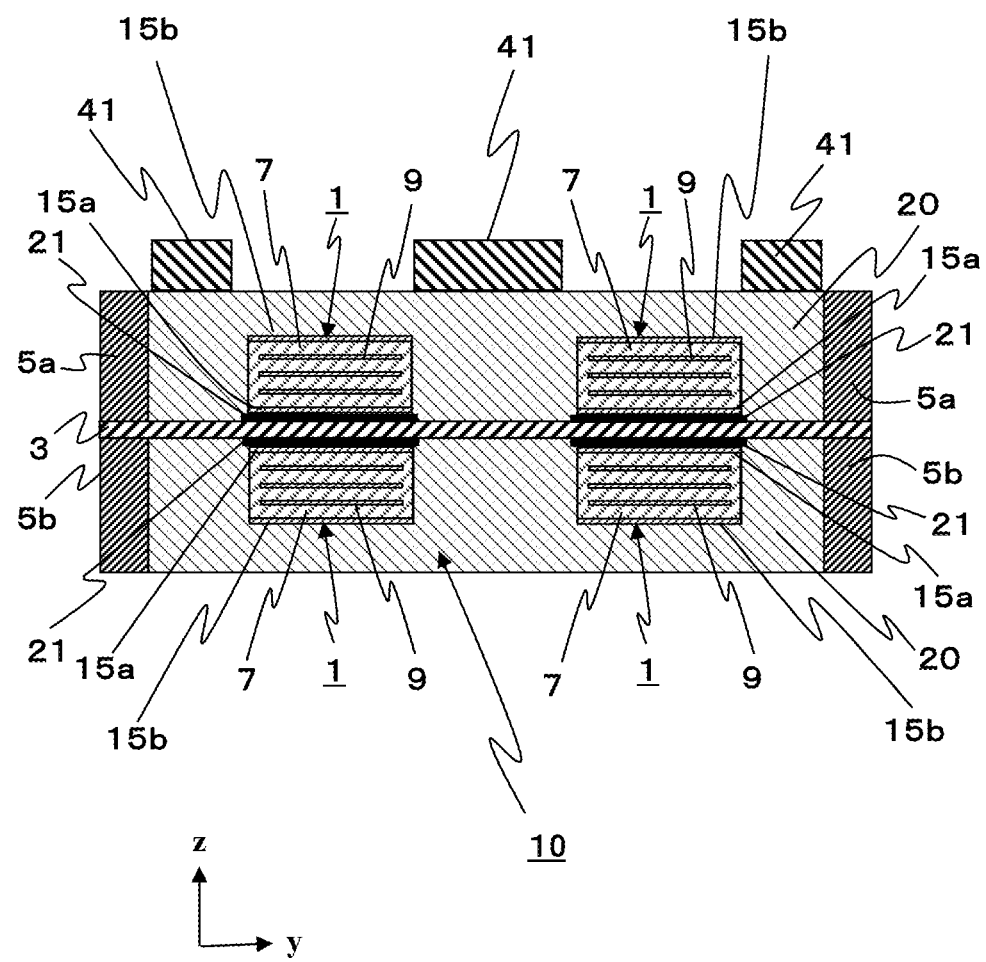
FIG. 5 is a cross-sectional view taken along a line B-B' in FIG. 4.

FIG. 4 is a schematic plan view showing a vibration device according to a third embodiment of the present invention. FIG. 5 is a cross-sectional view taken along a line B-B' in FIG. 4. For the sake of visual clarity, the resin layer 20 is excluded from FIG. 4, and FIG. 5 is illustrated in an enlarged scale in a thickness direction of the vibration device (z-axis direction in FIG. 5). The description of this embodiment will be focused on differences from the vibration device according to the first embodiment shown in FIG. 1 and FIG. 2, and the same constituents are given the same numeral and the description thereof will not be repeated.

In the vibration device according to this embodiment, as shown in FIG. 4 and FIG. 5, three load members 41 are provided in the central region of the rectangular vibration body 10 in the longitudinal direction (x-axis direction in FIG. 4), at both end portions and the central portion of the vibration body 10 in the width direction (y-axis direction in FIGS. 4 and 5). In other words, the exciters 1 and the load members 41 are aligned in the width direction of the rectangular vibration body 10 in the central region thereof in the longitudinal direction, the exciters 1 and the load members 41 being alternately located so that each of the exciters 1 is interposed between the adjacent load members 41.

In the vibration device configured as above according to this embodiment, the vibration of the central region of the vibration body 10 in the longitudinal direction, where the amplitude is prone to increase, can be generally suppressed by the load member 41, and disturbance against the smooth vibration can be prevented, unlike in the case where the exciters 1 and the load members 41 are stacked in the thickness direction of the vibration body 10.

(Fourth Embodiment)

Figure 6:
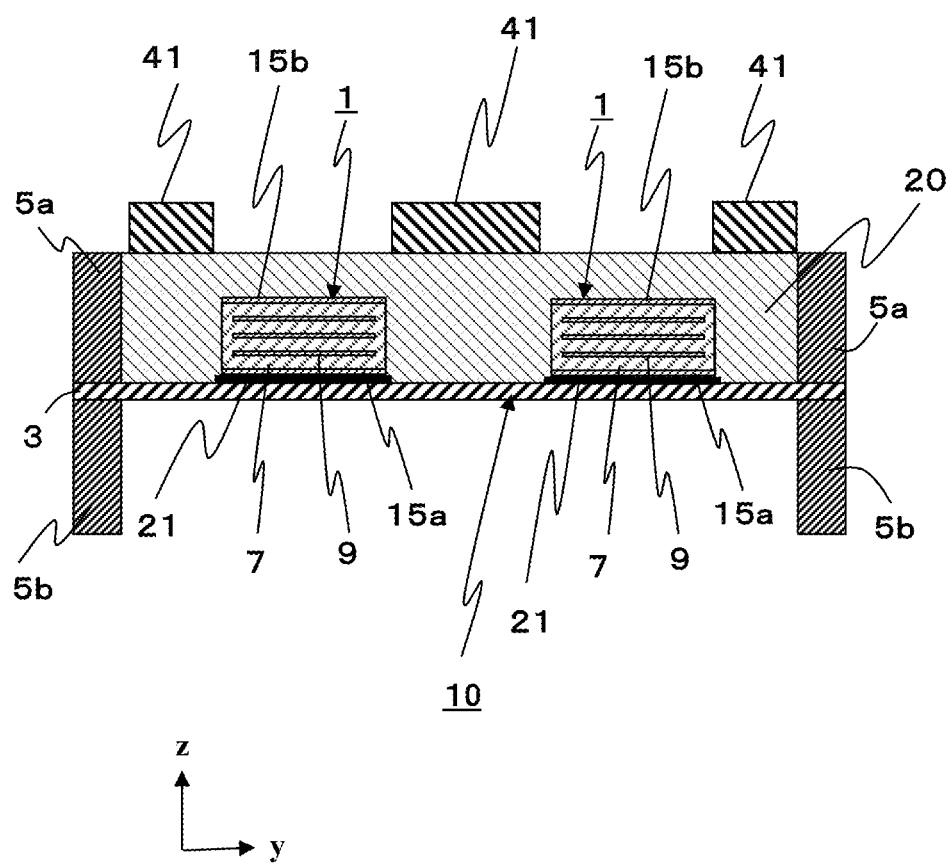
FIG. 6 is a schematic cross-sectional view showing a vibration device according to a fourth embodiment of the present invention.

FIG. 6 is a schematic cross-sectional view showing a vibration device according to a fourth embodiment of the present invention. The description of this embodiment will be focused on differences from the vibration device according to the third embodiment shown in FIG. 4 and FIG. 5, and the same constituents are given the same numeral and the description thereof will not be repeated. For the sake of visual clarity, FIG. 6 is illustrated in an enlarged scale in a thickness direction of the vibration device (z-axis direction in FIG. 6).

In the vibration device according to this embodiment, the two exciters 1 are attached to only one of the surfaces of the film 3, as shown in FIG. 6. The resin layer 20 is also formed only on the side where the exciters 1 are provided. Each of the exciters 1 is a bimorph piezoelectric element, as in the vibration device according to the second embodiment. The vibration device thus configured according to this embodiment also works in the same way as the vibration device according to the third embodiment.

(Fifth Embodiment)

Figure 7:
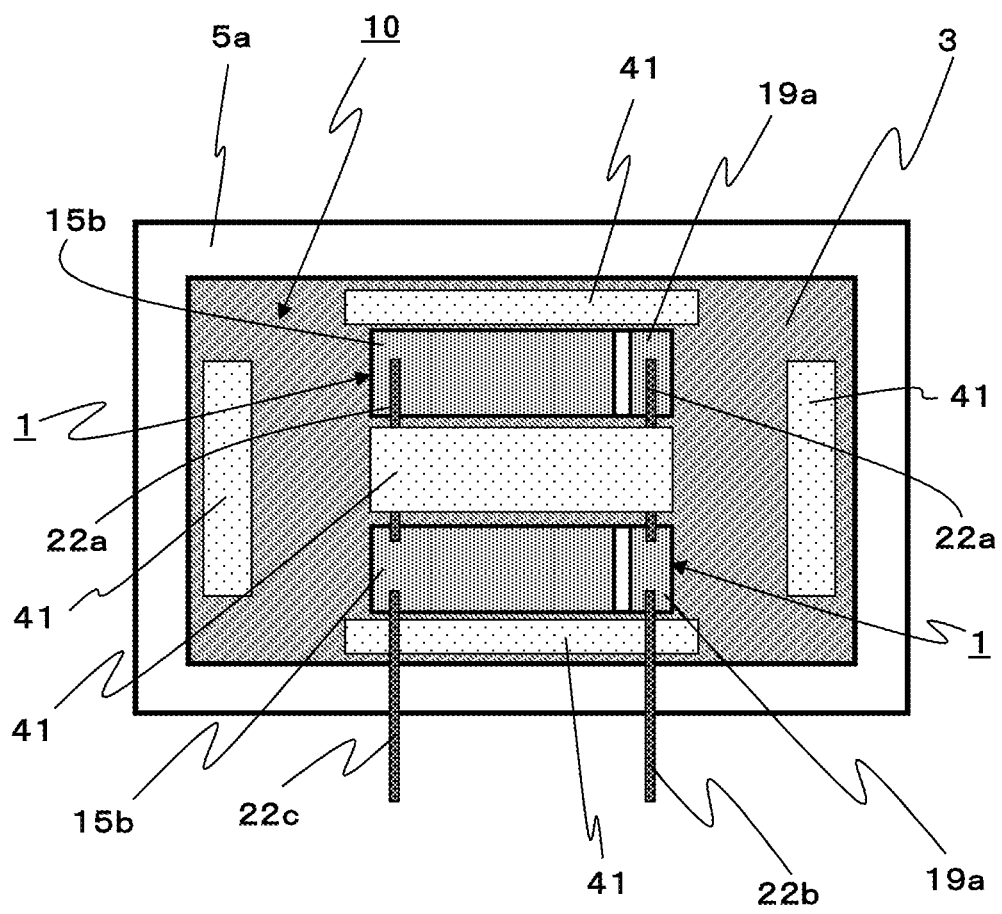
FIG. 7 is a schematic cross-sectional view showing a vibration device according to a fifth embodiment of the present invention.

FIG. 7 is a schematic plan view showing a vibration device according to a fifth embodiment of the present invention. For the sake of visual clarity, the resin layer 20 is excluded from FIG. 7. The description of this embodiment will be focused on differences from the vibration device according to the sixth embodiment shown in FIG. 6, and the same constituents are given the same numeral and the description thereof will not be repeated.

In the piezoelectric vibration device according to this embodiment, as shown in FIG. 7, the exciters 1 are attached to the central region of the flat-shaped vibration body 10 in the longitudinal direction (x-axis direction in FIG. 7), and additional load members 41 are provided in a region of the vibration body 10 between the region where the exciters 1 are located and the respective end portions of the vibration body 10 in the longitudinal direction. In other words, one each of the load members 41 is attached to the regions of the vibration body 10 between the region where the exciters 1 are located and the end portions in the longitudinal direction.

The additional load members 41 are located closer to the respective end portions, than to a central region between the region where the exciters 1 are located and the end portions in the longitudinal direction. The positions where the additional load members 41 are provided correspond to the position where the amplitude of tertiary resonance in the longitudinal direction of the vibration body 10 becomes largest.

In the vibration device configured as above according to this embodiment, since the load members 41 are provided at the positions where the amplitude of tertiary resonance in the longitudinal direction of the vibration body 10 becomes largest, a sharp increase in amplitude at the frequency of the tertiary resonance in the longitudinal direction of the vibration body 10 can be suppressed. Thus, since the sharp increase in acoustic pressure at the frequency of the tertiary resonance in the longitudinal direction of the vibration body 10 can be suppressed when the sound is generated from the vibration of the vibration body 10, a sharp increase in acoustic pressure at a specific frequency can be more effectively suppressed. Here, although the entire periphery of the flat-shaped vibration body 10 is supported in FIG. 7, a different configuration may be adopted. It suffices that at least the end portions of the vibration body 10 in the longitudinal direction are supported.

(Sixth Embodiment)

Figure 8:
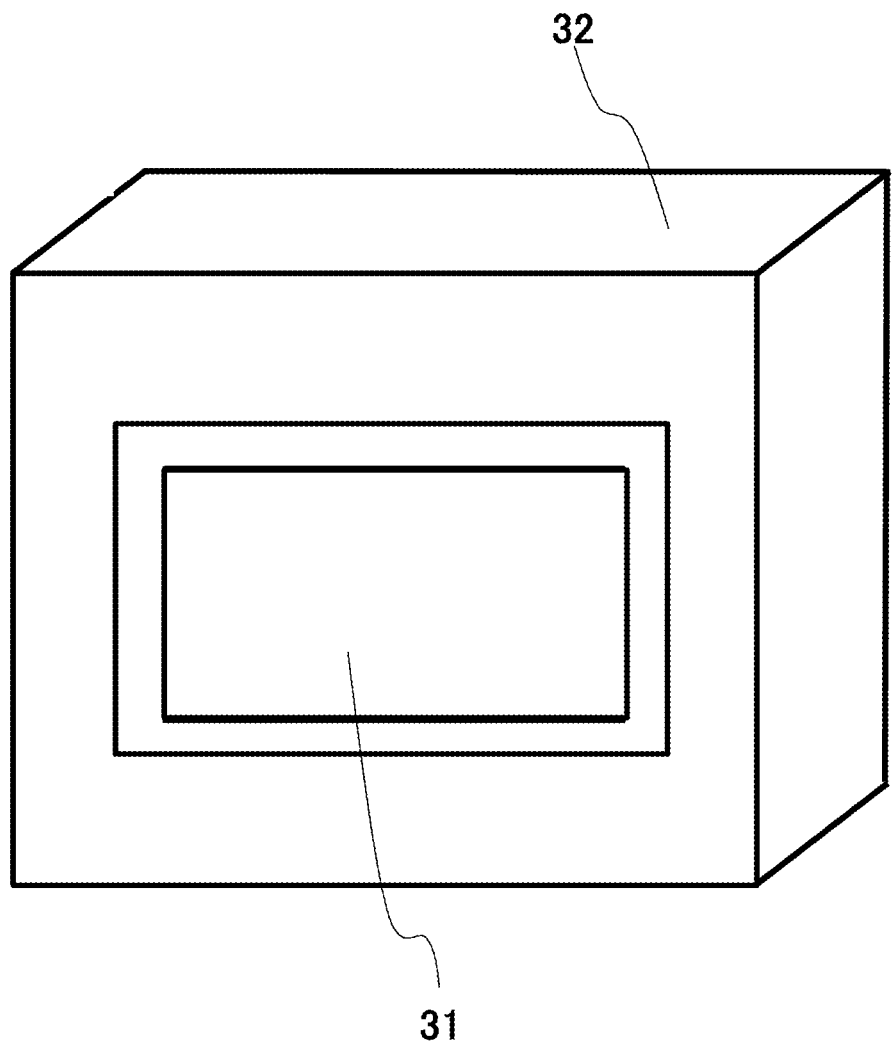
FIG. 8 is a perspective view showing an acoustic generator according to a sixth embodiment of the present invention.

FIG. 8 is a perspective view showing an acoustic generator according to a second embodiment of the present invention. The acoustic generator according to this embodiment includes a speaker 31 and a housing 32, as shown in FIG. 8.

The speaker 31 is configured to generate a sound including a sound out of the audible frequency band when an electrical signal is inputted and, though details are not shown, includes the vibration device according to the first to the fifth embodiments of the present invention.

The housing 32 has a rectangular block box shape. The housing 32 includes at least one opening, and the speaker 31 is attached to one of the at least one opening. The housing 32 serves as a support member that supports the speaker 31. The housing 32 also serves to suppress wraparound of an antiphase sound outputted from the rear side of the speaker 31, and to reflect the sound outputted from the speaker 31 inside of the housing 32. The housing 32 may be formed of a material having a rigidity sufficient to support the speaker 31, for example wood, a synthetic resin, and a metal.

The acoustic generator according to this embodiment is configured to generate a sound from the speaker 31 that includes the vibration device according to the first to the fifth embodiments of the present invention. Therefore, the acoustic generator is capable of suppressing drastic fluctuation of the acoustic pressure at a specific frequency, and thus generating a sound with a reduced peak dip of the acoustic pressure in the frequency characteristic.

In addition, since the acoustic generator according to this embodiment includes the housing 32, the acoustic generator can support the speaker 31, and can also improve the quality of the sound compared with the sound generated by the speaker 31 alone.

(Seventh Embodiment)

Figure 9:
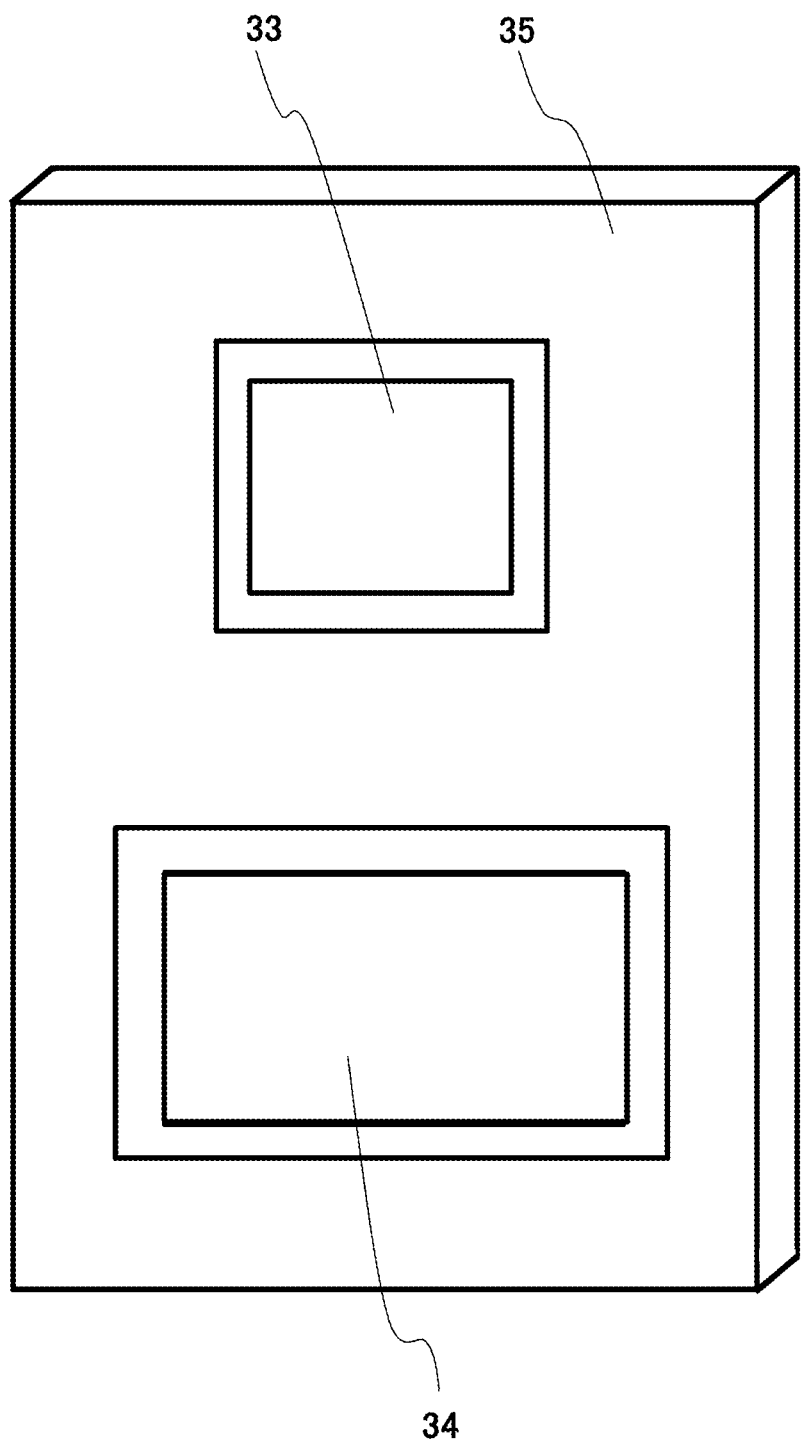
FIG. 9 is a perspective view showing a speaker system according to a seventh embodiment of the present invention.

FIG. 9 is a schematic perspective view showing a speaker system according to a seventh embodiment of the present invention. The speaker system according to this embodiment includes, as shown in FIG. 9, at least one high range speaker 33, at least one low range speaker 34, and a support member 35.

The low range speaker 34 is configured to primarily output a low-pitched tone of, for example, a frequency of 20 KHz or lower. The high range speaker 33 is configured to primarily output a high-pitched tone of, for example, a frequency of 20 kHz or higher. The high range speaker 33 has the longitudinal sides shorter than those of the low range speaker 34, to facilitate outputting of a high-frequency sound, but is configured similarly to the low range speaker 34 in other aspects. In this embodiment, at least one of the high range speaker 33 and the low range speaker 34 includes the vibration device according to the first to the fifth embodiments of the present invention.

The support member 35 includes a pair of openings, in which the high range speaker 33 and the low range speaker 34 are respectively accommodated and fixed. Thus, the support member 35 serves to support the high range speaker 33 and the low range speaker 34. The support member 35 may be formed of a material having a rigidity sufficient to support the high range speaker 33 and the low range speaker 34, for example wood, a synthetic resin, and a metal.

In the speaker system configured as above according to this embodiment, at least one of the high range speaker 33 and the low range speaker 34 includes the vibration device according to the first to the fifth embodiments of the present invention. Therefore, the speaker system is capable of suppressing drastic fluctuation of the acoustic pressure at a specific frequency, and thus generating a sound with a reduced peak dip of the acoustic pressure in the frequency characteristic.

(Eighth Embodiment)

Figure 10:
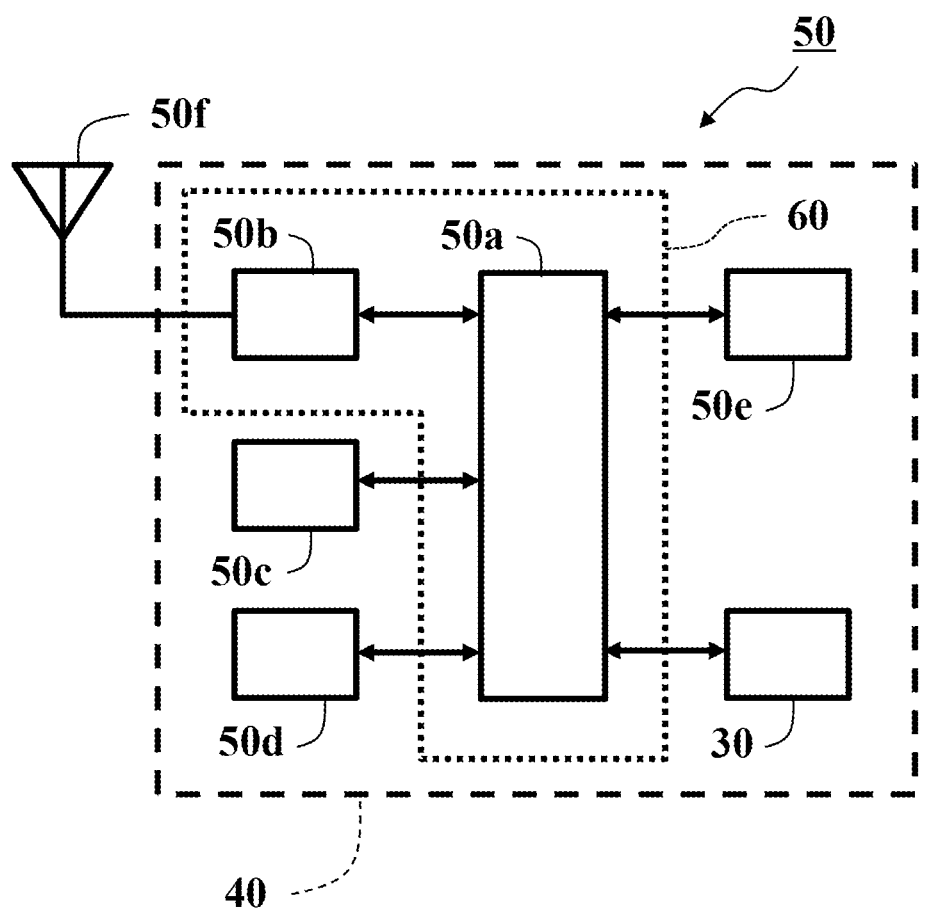
FIG. 10 is a block diagram showing a configuration of an electronic apparatus according to an eighth embodiment of the present invention.

FIG. 10 is a block diagram showing a configuration of an electronic apparatus 50 according to a fourth embodiment of the present invention. The electronic apparatus 50 according to this embodiment includes, as shown in FIG. 10, a speaker 30, a housing 40, an electronic circuit 60, a key input unit 50*c*, a microphone input unit 50*d*, a display unit 50*e*, and an antenna 50*f*.

The electronic circuit 60 includes a control circuit 50*a* and a communication circuit 50*b*. The electronic circuit 60 is connected to the speaker 30 so as to output a sound signal to the speaker. The control circuit 50*a* serves as a control unit of the electronic apparatus 50. The communication circuit 50*b* transmits and receives data through the antenna 50*f*, under the control of the control circuit 50*a*.

The key input unit 50*c* is an input device for the electronic apparatus 50, and accepts an input of an operator made by key operation. The microphone input unit 50*d* is another input device for the electronic apparatus 50, and accepts an input of a verbal message of the operator. The display unit 50*e* serves as the display output device of the electronic apparatus 50, and outputs a display of information under the control of the control circuit 50*a*.

The speaker 30 includes, like the speaker 31, the high range speaker 33, and the low range speaker 34, the vibration device according to the first to the fifth embodiments of the present invention. The speaker 30 serves as the sound output device of the electronic apparatus 50, and is configured to generate a sound including a sound out of the audible frequency band, according to a sound signal inputted from the electronic circuit 60. Here, the speaker 30 is connected to the control circuit 50*a* of the electronic circuit 60, and generates a sound upon receipt of a voltage controlled by the control circuit 50*a*.

The housing 40 accommodates therein the electronic circuit 60 and so forth for protection. The speaker 30, the key input unit 50*c*, the microphone input unit 50*d*, the display unit 50*e*, and the antenna 50*f* are fixed to the housing 40, and therefore the housing 40 serves as the support member for the speaker 30, the key input unit 50*c*, the microphone input unit 50d, the display unit 50e, and the antenna 50f. Although the speaker 30, the electronic circuit 60, the key input unit 50c, the microphone input unit 50d, and the display unit 50e are accommodated in the housing 40 in FIG. 5, the electronic apparatus 50 may be differently configured. The speaker 30, the electronic circuit 60, the key input unit 50c, the microphone input unit 50d, and the display unit 50e may be exposed in the surface of the electronic apparatus 50. The housing 40 may be formed of a material having a rigidity sufficient to support the speaker 30 and so forth, for example wood, a synthetic resin, and a metal.

The electronic apparatus 50 according to this embodiment is configured to generate a sound by using the speaker 30 that includes the vibration device according to the first to the fifth embodiments of the present invention. Therefore, the electronic apparatus 50 is capable of suppressing drastic fluctuation of the acoustic pressure at a specific frequency, and thus generating a sound with a reduced peak dip of the acoustic pressure in the frequency characteristic.

Here, it suffices that the electronic apparatus 50 at least includes the speaker 30, the support member that supports the speaker 30, and the electronic circuit 60. It is not mandatory that the electronic apparatus 50 includes all of the speaker 30, the housing 40, the electronic circuit 60, the key input unit 50c, the microphone input unit 50d, the display unit 50e, and the antenna 50f. Conversely, the electronic apparatus 50 may include one or more other constituents. The configuration of the electronic circuit 60 is not limited to the above either, but may be configured in a different manner.

The electronic apparatus in which the speaker 30 can be incorporated is not limited to portable terminals such as a mobile phone and a mobile tablet. The speaker 30 including the vibration device according to the first to the fifth embodiments can be employed as the acoustic generator of various kinds of electronic apparatuses configured to generate a sound. The speaker 30 including the vibration device according to the first to the fifth embodiments may be employed typically in a flat-panel TV and a car audio system, and also in various other electronic apparatuses configured to generate a sound, such as a vacuum cleaner, a washing machine, a refrigerator, and a microwave oven.

(Variation)

The present invention is in no way limited to the foregoing embodiments, but may be modified or improved in various manners within the scope of the present invention.

For the sake of visual clarity of the drawings, two exciters 1 are mounted on each of the surfaces of the film 3 in the foregoing embodiments. However, a different configuration may be adopted. For example, a larger number of exciters 1 may be provided on the film 3.

Although one, three, or five load members 41 are provided in the foregoing embodiments, a different configuration may be adopted. For example, a larger number of load members 41 may be provided. The positions to attach the load members 41 are not limited to the foregoing embodiments, either. For example, the load member 41 may be attached to the surface of the film 3 opposite to the surface to which the exciters 1 are attached.

Although the film 3 is employed as the diaphragm in the foregoing embodiments, a different material may be adopted. For example, a plate-shaped diaphragm made of a metal or a resin may be employed.

Further, although the resin layer 20 is provided to cover the surfaces of the exciters 1 and the film 3 in the foregoing embodiments, a different configuration may be adopted. The resin layer 20 may be excluded.

Further, although the piezoelectric elements are employed in the exciter 1 in the foregoing embodiments, a different configuration may be adopted. The function expected from the exciter 1 is conversion of an electrical signal into mechanical vibration, and therefore any material capable of converting an electrical signal into mechanical vibration may be employed as the exciter 1. An exciter known to cause a speaker to vibrate, for example an electrokinetic exciter, an electrostatic exciter, or an electromagnetic exciter may be employed as the exciter 1. Here, the electrokinetic exciter is configured to supply a current to a coil located between the respective poles of permanent magnets so as to vibrate the coil. The electrostatic exciter is configured to apply a bias and an electrical signal to a pair of metal plates opposed to each other, so as to cause the metal plates to vibrate. The electromagnetic exciter is configured to provide an electrical signal to a coil so as to cause a thin iron plate to vibrate.

Working Example

A specific example of the vibration device according to the present invention will be described hereunder. The vibration device according to the second embodiment of the present invention shown in FIG. 3, and the vibration device according to the fourth embodiment of the present invention shown in FIG. 6 were made up, and the characteristic thereof was evaluated.

First, powder of a piezoelectric material containing lead zirconate titanate (PZT) in which a part of Zr was substituted with Sb, a binder, a dispersion agent, a plasticizer, and a solvent were kneaded in a ball mill for 24 hours, to make up the slurry. From the slurry thus made up, the green sheet was formed by a doctor blade method. A conductive paste containing Ag and Pd was applied to the green sheet in a predetermined pattern by a screen printing method, thus to form a conductor pattern to be finished as the inner electrode layer 9. The green sheets with the conductor pattern formed thereon and other green sheets were stacked and pressurized, to thereby form the multilayer block. The multilayer block was degreased in ambient air at 500° C. for an hour, and then sintered in ambient air at 1100° C. for three hours, thus to obtain the multilayer structure.

Then the end faces of the multilayer structure in the longitudinal direction were cut with a dicing machine, so as to expose the leading end portion of the inner electrode layer 9 in the lateral faces of the multilayer structure. A conductive paste containing Ag and glass was then applied to the both main surfaces of the multilayer structure by a screen printing method, to thereby form the surface electrode layers 15a, 15b and the electrode layer 19a. After that, a conductive paste containing Ag and glass was applied by dipping to the lateral faces of the multilayer structure in the longitudinal direction, and baked in ambient air at 700° C. for ten minutes, to form the pair of outer electrodes. Thus, the multilayer structure was finished. The length and width of the main surface of the finished multilayer structure were 46 mm and 18 mm, respectively. The thickness of the multilayer structure was 100 μm. A voltage of 100 V was applied to the multilayer structure for two minutes through the pair of outer electrodes for polarization, thus to obtain the exciter 1, made up as a bimorph piezoelectric element.

Then the film 3 formed of a film-shaped polyimide resin having a thickness of 25 μm was prepared, and the outer peripheral portion thereof was bonded between the frame members 5a, 5b of the second frame member 5 with an adhesive, with a tension applied to the film 3, and the adhesive was cured thus to fix the film 3. The frame members 5a, 5b were both made of a stainless steel having a thickness of 0.5 mm. The length and width of the film 3 inside the frame members 5a, 5b were 100 mm and 70 mm, respectively. The exciters 1 were bonded to one of the main surfaces of the film 3 fixed as above with an adhesive of an acrylic-based resin. The exciters 1 were placed with a spacing of 10 mm therebetween. After that, the leads 2a, 2b, 2c were connected to the exciters 1 to form the wiring. Then an acrylic-based resin, having such a property that the Young's modulus becomes 17 MPa upon being cured, was filled in the inner region of the frame member 5a up to the same level as the frame member 5a, and then cured so as to form the resin layer 20.

The load members 41 were then bonded to the surface of the resin layer 20 with an adhesive of an acrylic-based resin. Urethane foam of 1 mm in thickness was employed as the load members 41. For the vibration device according to the second embodiment, the load member 41 was attached at the position shown in FIG. 1 and FIG. 3, and for the vibration device according to the fourth embodiment the load members 41 were attached at the positions shown in FIG. 4 and FIG. 6.

Figure 11:
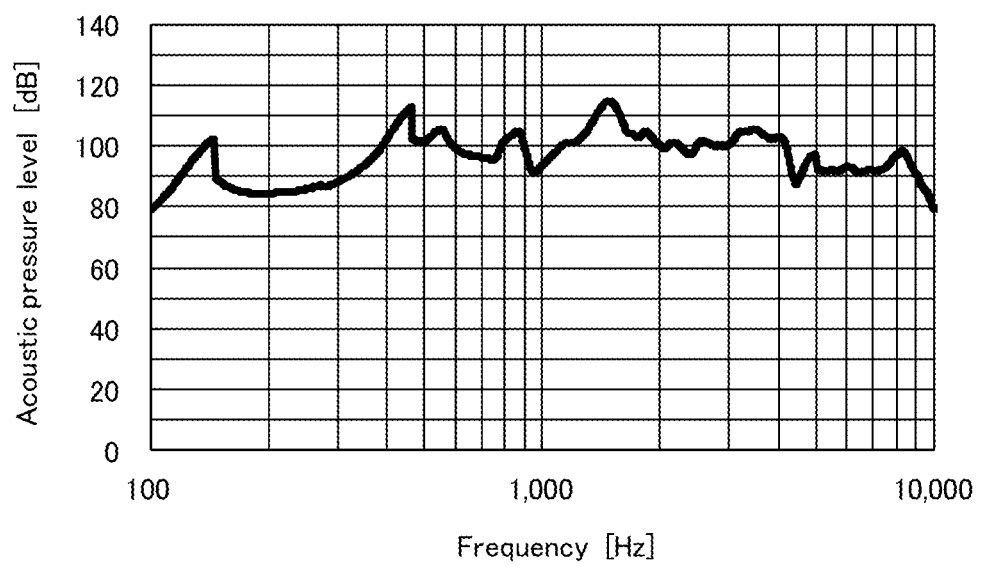
FIG. 11 is a graph showing a frequency characteristic of the acoustic pressure of the vibration device according to the second embodiment of the present invention.
Figure 12:
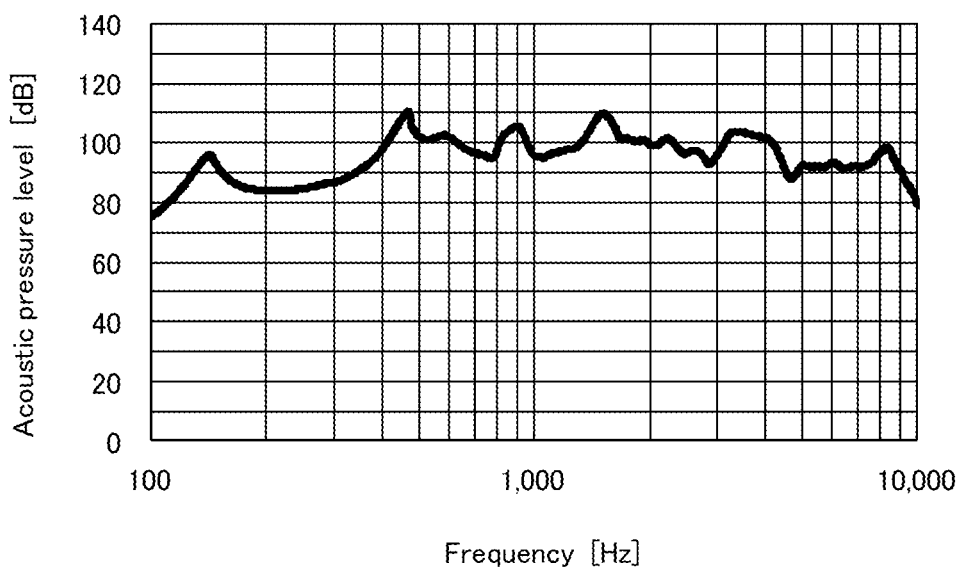
FIG. 12 is a graph showing a frequency characteristic of the acoustic pressure of the vibration device according to the fourth embodiment of the present invention.
Figure 13:
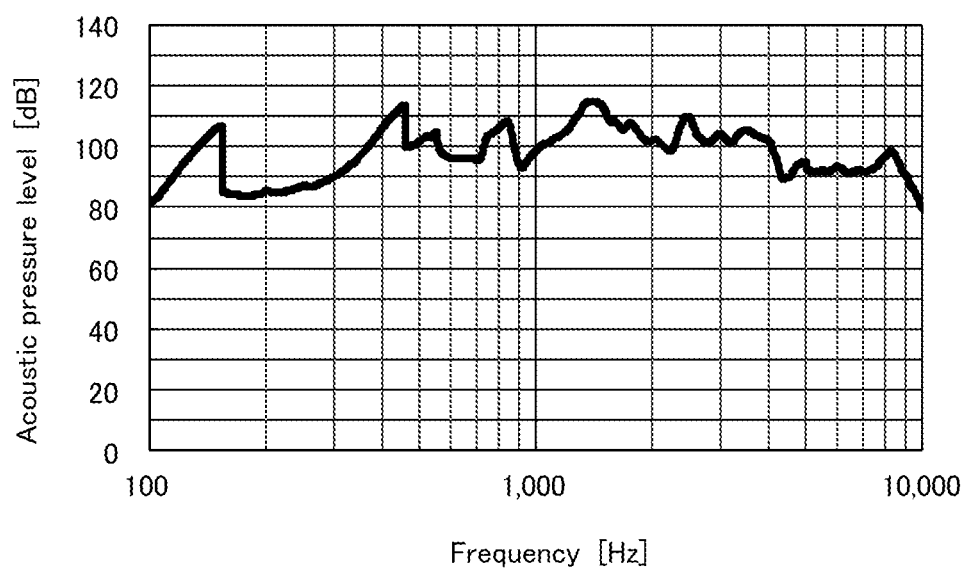
FIG. 13 is a graph showing a frequency characteristic of the acoustic pressure of the vibration device according to a comparative example.

The frequency characteristic of the acoustic pressure of the sound generated by the vibration device made up as above was measured according to EIJARC-8124A specified by Japan Electronics and Information Technology Industries Association (JEITA). In the measurement, a sine wave signal of 5 Vrms was inputted between the leads 22b and 22c of the vibration device, and the acoustic pressure was measured with a microphone placed at 0.1 m from the vibration device along the reference axis thereof. FIG. 11 shows the measurement result of the sound generated by the vibration device according to the second embodiment of the present invention, and FIG. 12 shows the measurement result of the sound generated by the vibration device according to the fourth embodiment. FIG. 13 shows the measurement result of the sound generated by a vibration device according to a comparative example, made up without the load member 41. In the graphs shown in FIG. 11 to FIG. 13, the horizontal axis represents the frequency, and the vertical axis represents the acoustic pressure.

Through comparison with FIG. 13 showing the frequency characteristic of the acoustic pressure of the sound generated by the vibration device according to the comparative example, it is understood that, as shown in FIG. 11, the sound generated by the vibration device according to the second embodiment presents a smooth acoustic pressure characteristic with a reduced peak dip. In addition, as is understood from FIG. 12 showing the frequency characteristic of the acoustic pressure of the sound generated by the vibration device according to the fourth embodiment, an even smoother acoustic pressure characteristic with a further reduced peak dip was achieved. This proves the effectiveness of the present invention.

REFERENCE SIGNS LIST

1 Exciter
10 Vibration body
30, 31 Speaker
32, 40 Housing
33 High range speaker
34 Low range speaker
35 Support member
41 Load member
50 Electronic apparatus
60 Electronic circuit

The invention claimed is:

1. A vibration device comprising:
a vibration body including a film and a resin layer;
an exciter that is a piezoelectric vibration element disposed on a first surface of the film, the exciter causing the vibration body to vibrate, the exciter and the first surface of the film being covered with the resin layer; and
a load member attached to a part of the vibration body and spaced apart from the exciter, and configured to reduce amplitude of the part of the vibration body where the load member is attached.

2. The vibration device according to claim 1, wherein the load member is attached to a portion of the vibration body where the amplitude becomes maximal at least at a part of a vibration frequency range of the vibration body.

3. The vibration device according to claim 1, wherein the vibration body has an elongate shape extending in one direction, at least both end portions of the vibration body in a longitudinal direction are supported, and the load member is attached to at least a part of a central portion of the vibration body in the longitudinal direction.

4. The vibration device according to claim 1, wherein the vibration body has an elongate shape extending in one direction, at least both end portions of the vibration body in the longitudinal direction are supported, the exciter is attached to the central portion of the vibration body in the longitudinal direction, and the load member is attached to the vibration body at a position between the portion where the exciter is attached and the end portion in the longitudinal direction.

5. The vibration device according to claim 1, wherein the vibration body has a plate shape or a film shape, and has an overall periphery thereof supported, and the load member is attached to the central portion of the vibration body.

6. The vibration device according to claim 1, wherein the vibration device emits, by causing the vibration body to vibrate, a sound to one side of a vibration direction of the vibration body, and the load member is formed of a porous material and attached to the surface of the vibration body on the side of the one direction.

7. An acoustic generator comprising:
at least one speaker; and
a support member to which the speaker is attached,
wherein the speaker includes the vibration device according to claim 1.

8. A speaker system comprising:
at least one low range speaker;
at least one high range speaker; and
a support member that supports the low range speaker and the high range speaker,
wherein at least one of the low range speaker and the high range speaker includes the vibration device according to claim 1.

9. An electronic apparatus comprising:
at least one speaker;
a support member to which the speaker is attached; and
an electronic circuit connected to the speaker,
wherein the speaker includes the vibration device according to claim 1,
the electronic apparatus being configured to generate a sound from the speaker.

* * * * *